March 8, 1966 P. J. McCABE 3,238,624

PRINTED CIRCUIT LAYOUT MACHINE

Filed March 13, 1962 3 Sheets-Sheet 1

INVENTOR
PHILIP J. McCABE

BY Hurvitz & Rose

ATTORNEYS

March 8, 1966 P. J. McCABE 3,238,624

PRINTED CIRCUIT LAYOUT MACHINE

Filed March 13, 1962 3 Sheets-Sheet 2

INVENTOR

PHILIP J. McCABE

BY Hurvitz & Rose

ATTORNEYS

March 8, 1966 P. J. McCABE 3,238,624

PRINTED CIRCUIT LAYOUT MACHINE

Filed March 13, 1962 3 Sheets-Sheet 3

INVENTOR
PHILIP J. McCABE

BY Hurwitz & Rose

ATTORNEYS

United States Patent Office 3,238,624

Patented Mar. 8, 1966

3,238,624
PRINTED CIRCUIT LAYOUT MACHINE

Philip J. McCabe, Vienna, Va., assignor to Melpar, Inc., Falls Church, Va., a corporation of Delaware Filed Mar. 13, 1962, Ser. No. 179,414
7 Claims. (Cl. 33—23)

The present invention relates generally to systems for laying out art work for printed circuitry, and more particularly to a printed circuit layout machine which facilitates the conversion of a rough printed circuit layout sketch into an accurately laid out full sized transparency, having accurately located reference holes and connecting lines, which is capable of economical operation by semi-skilled personnel, and which can also be employed for accurately drilling etched circuits and fabricating drill jigs.

In a co-pending application of John D. Forsyth, Serial No. 47,535, filed August 4, 1960 and bearing the title "Printed Circuit Layout Machine," there is disclosed a method and machine for preparing photographic masks for printed circuit artwork. In the co-pending application, a sketch of a desired circuit layout is placed over a reference grid and a stylus is arranged to move over the sketch. The stylus is locked mechanically to a carrier for an opaque sheet, and moves the latter with respect to a fixed punch device. When the stylus is over a point on the sketch where a hole is desired, the punch is activated and a corresponding hole is made in the opaque sheet, subject to guidance by the reference grid. After the holes are punched in the opaque sheet, a photographic process is employed to expose a photosensitive film through the punched sheet, to provide printed circuit art work. The reference grid is employed so that very accurate locating of the holes may be achieved without requiring extremely accurate dimensioning of the sketch.

It has been found, because of the great movement required of the opaque sheet as it follows the stylus, that a machine of desirably small size it not attainable employing the Forsyth principle. Also, inscribing or routing of lines in the opaque sheet has not proven feasible when the sheet is moved under a fixed inscribing element. There is thus necessitated hand drafting and photographic masking techniques to provide lines joining reference points generated by the machine. The present invention obviates certain of these difficulties by employing a fixed grid and a movable stylus. A chuck for holding a drill or scribing element is moved together with the guide stylus. Thereby, the total volume occupied by the machine is considerably reduced, and scribing of lines in the opaque sheet becomes feasible.

When all of the required holes and lines have been punched or inscribed on the Mylar sheet, a photosensitized paper can be located under it and exposed to light through the apertures (holes and lines) in the sheet. The exposed paper can then be developed and utilized as a layout for fabrication of printed circuit artwork, according to standard practice.

Holes may be accurately transferred, on a 1:1 basis dimensionally, by means of the present system, from a rough sketch, to a final sheet of art work, and photographic steps may be obviated.

It is required, in preparing printed circuit artwork, to provide lands and conductors. These may, according to the invention, be provided rough or free hand on the sketch of the circuit board. They are then transferred to the final art work subject to guidance from a template, which is accurately fixed with respect to the grid. The art work itself is prepared on a thin flexible sheet of Mylar, which is itself a transparent material, but which is coated with an opaque layer. The opaque layer only is routed out, in providing lands and conductors, leaving the Mylar intact except for the holes drilled therethrough. In consequence the final art work is full size, accurate, and directly usable without interposition of a photographic process. Circuit boards may be directly printed from the drilled and routed sheet, which corresponds with a negative, photographically. Clearly, the sheet may also be utilized to print a positive photographically, or to produce a screen, from which printing may take place.

The system of the present invention assures that the key points of a printed circuit layout will fall precisely according to a grid pattern, i.e., that each key point of the printed circuit will conform precisely to a grid point. These latter are accurately machined, so that location is attained to within 0.005 inch of true position. Location of the keypoints and conductors, i.e., points of eyelets, contact bars, component mark mounting points and the like, is then sufficiently accurate to enable automatic assembly of elements on the circuit board.

Prior to the development of the machine disclosed in the co-pending application of Forsyth, referred to above, it was necessary, in preparing printed circuit artwork, for a draftsman to manually locate with ink, tape or pencils the critical points of the artwork. This was normally done by the draftsman on an enlarged scale, as high as 20 to 1 with respect to the ultimate product, and it was necessary to reduce the artwork photographically to the desired size. Considerable drafting material was required, the photographic reduction process was expensive and a competent highly-paid draftsman consumed considerable time in attempting to secure the accuracy required. The usual problems of drafting with ink, i.e. chipping of ink, smudging of ink or pencil marks, and creepage of tapes introduced difficult handling and storage problems for the sheets prepared by the draftsman. Additionally, the photographic scaling process introduced opportunity for serious errors due to optical aberrations, careless handling, imperfect equipment, and the like.

According to the present invention, a draftsman need provide only a rough layout, which can be discarded after being used once, and replaced by a Mylar sheet which is utilized as the photographic reference. Photographic exposure can be made on conventionally sensitive film and a positive print will directly result, if desired, but photographic work is not required.

The present system, accordingly, provides a precise, rapid, economical and compact apparatus for preparing artwork for printed circuitry requiring only semi-skilled personnel. Cost and time in preparing the finished product are minimized and opportunity for error or inaccuracy largely eliminated.

It is an object of the present invention to provide a new and improved system for preparing photographic reference sheets for fabrication of printed circuits.

It is another object of the present invention to provide a system for preparing printed circuit artwork requiring no photographic scaling and resulting in perfect location of critical points and lines of the artwork.

It is still another object of the present invention to provide a system for producing photographic masks for printed circuit artwork wherein lines and holes are inserted on a reference sheet by reference to an accurately machined grid, and a drilling or routing tool is moved in locked relation with a stylus, over the grid.

It is a further object of the present invention to provide a system wherein a grid for control of hole and line placement is fixedly positioned with respect to an opaquely coated sheet of transparent material, utilized for making photographic masks and a drill is movable, in conjunction with a guide stylus, to points over the sheet corresponding with grid points.

It is another object of the present invention to provide a system for inserting both lines and holes on an opaque master sheet fixedly positioned with respect to a reference grid structure wherein either drill or routing elements may be secured to an element scanning the opaque sheet.

The above and still further objects, features and advantages of the present invention will become apparent upon consideration of the following detailed description of one specific embodiment thereof, especially when taken in conjunction with the accompanying drawings, wherein.

Figures 1, 4, 5:
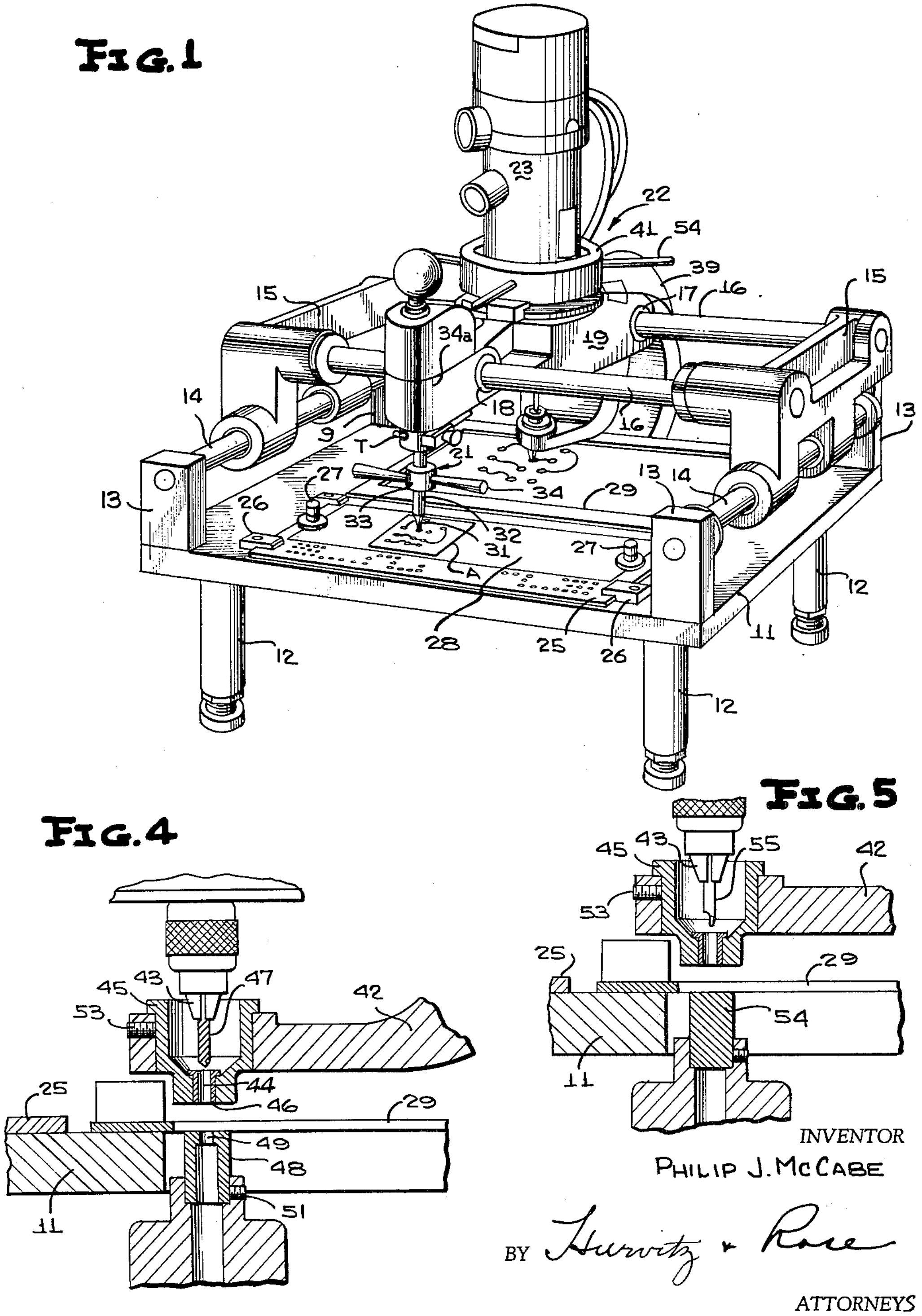
FIGURE 1 is a view in perspective of a machine according to a preferred embodiment of the present invention.
FIGURE 4 is a view in section of drilling structure details.
FIGURE 5 is a cross sectional view of routing apparatus, which may be substituted for the drilling apparatus of FIGURE 4.
Figure 2:
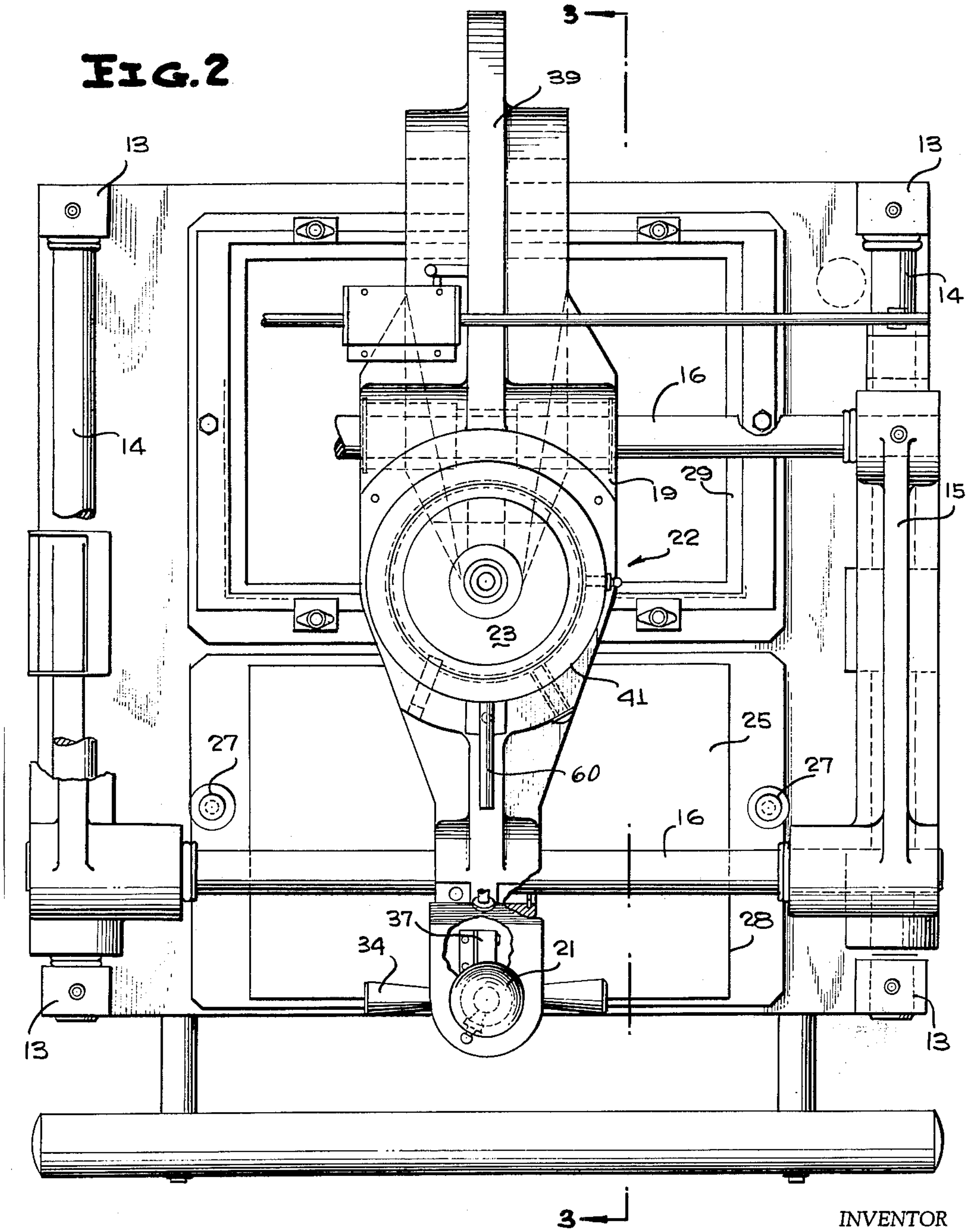
FIGURE 2 is a top plan view of the apparatus shown in FIGURE 1.

Reference is now made to FIGURE 1 of the drawings which discloses a base 11 having four downwardly extending legs 12 and four upwardly extending arms 13, the arms and the legs being located substantially at the corners of base 11. Located between the arms 13 which are located at the sides of base 11, are longitudinal carriage shafts 14 which support the left and right carriage elements 15, respectively, which are capable of forward and rearward movement, and carry a pair of transversely extending carriage shafts 16. Transversely extending carriage shafts 16 extend through bearings 17 and 18 in a main carriage 19 which carries stylus member 21 and the drill and routing mechanism 22. The drilling and routing mechanism 22 includes a drill head pneumatically activated subassembly 23 mounted on carriage 19. Carriage 19 is manually movable to any point on base 11 by means of spherical knob 24, mounted above the stylus assembly 21. The carriage 19 moves without much effort on the part of the operator but has sufficient friction with respect to shafts 14 and 16 to maintain it in a fixed position, except when force is exerted by the operator.

Grid or reference template 25 is fixedly mounted on base 11 by clamps 26. The clamps 26 are adjustable so that different grids, having different size index holes, may be utilized. A sheet of artwork A is positioned above grid 25 and held in position by locating pins 27, located at either side of the grid. The artwork A has been prepared by a draftsman in free-hand style to correspond approximately with a desired layout of a final printed circuit board. In fixedly mounted relationship behind grid assembly 25 and the artwork A is positioned a sheet of opaque material 29, e.g. transparent "Mylar," coated with opaque material. The Mylar sheet 29 is positioned so that the drill or routing carriage 22 is positioned thereover for all positions of stylus assembly 21.

The stylus assembly 21 includes a tapering stylus point 31 which nests snugly in an opening in grid 25. Stylus 31 is an extension of rod 32, which extends through collar 33. Extending from opposite arms of collar 33 are a pair of handles 34, adapted to be manually grasped by the operator. Rod 32 extends into a housing *34a*. Within housing *34a* is a spring 35, FIGURE 3, which normally urges a contact plate 36 into proximity with an upper wall of housing *34a*. Located beneath contact plate 36 is a microswitch 37 having a contact 38 which engages contact disc 36 when the stylus 31 is brought into contact with sheet 28 containing artwork as drawn by a draftsman. When plate 36 and contact 38 engage, an electric signal is generated for activating the drill head 23.

The rearward portion of the mechanism, which comprises the drill or routing apparatus, comprises cylindrical subassembly 23 for activating a drill or routing member against Mylar sheet 29. Extending rearwardly from carriage 19 is a rigid U-shaped member 39, one arm of which, 27, extends under base 11. Member 39 is rigidly secured to collar 41, surrounding cylinder 23. An arm 42 extends downwardly from the upper arm of member 39 and includes a bore, located under drill chuck 43, from which extends a bit 47. Located within the bore is a collar 45 which carries aligning sleeve 46 for bit 47. Collar 45 is maintained in place by set screw 53 so that collars of various diameters may be utilized for aligning different bit sizes.

At the other end of arm 39, on the under arm 37 of base 11, is a bore in which die 48 is adapted to fit when the apparatus is employed as a drilling mechanism. The die 48 includes a centrally located bore 49 which at its upper end engages and supports the under surface of Mylar sheet 29. The die 48 is maintained in fixed position by set screw 51 so that it may be removed when desired. The opposite ends of arm 39, at the upper and underneath side of base 11, are aligned so that hole 44 is aligned with bore 49. The arrangement of collar 45 relative to sleeve 46, and the bore of die 48 maintains the bit 47 in place as the drill is brought through the Mylar sheet 29.

During routing or grooving of the Mylar sheet, (see FIGURE 5) the bit 47 and die 48 are not utilized. For die 48 is substituted a block 54 and bit 47 is replaced by routing tool 55. The routing bit 55 is brought into contact with the upper surface of Mylar sheet 29, which is supported, on its lower surface, against block 54. As the stylus 31 is moved across the artwork 28 between holes which had been previously punched in the artwork, the gouging or routing tool moves in a corresponding manner over the Mylar sheet between the holes which have been drilled therein, removing the opaque layer thereon.

To control the placement of routing tool 55, collar 41, having a plurality of horizontally extending arms 60 is provided. The entire drill head subassembly 23 is lowered into position such that substantially all of the opaque coating on the Mylar sheet will be removed by the routing tool 55 as it moves in response to movement of the stylus 31. This is accomplished by manually lowering the subassembly 23 to correct routing level, and locking it in vertical position by rotating internally threaded collar 41, thereby lowering internal nut 56 into contact with outwardly flaring wall 57 of subassembly 23.

In routing lines, representing conductors in printed circuitry, in the Mylar sheet 29 it is frequently desirable to employ a template, rather than to rout free-hand. Such a template is fixed in location manually while the stylus 31 engages suitable slots located therein, such slots serving as guides for the stylus and thereby controlling accurately the movement of the routing tool 55 between previously punched holes in the Mylar sheet, corresponding with holes in the worksheet.

Figures 3, 6:
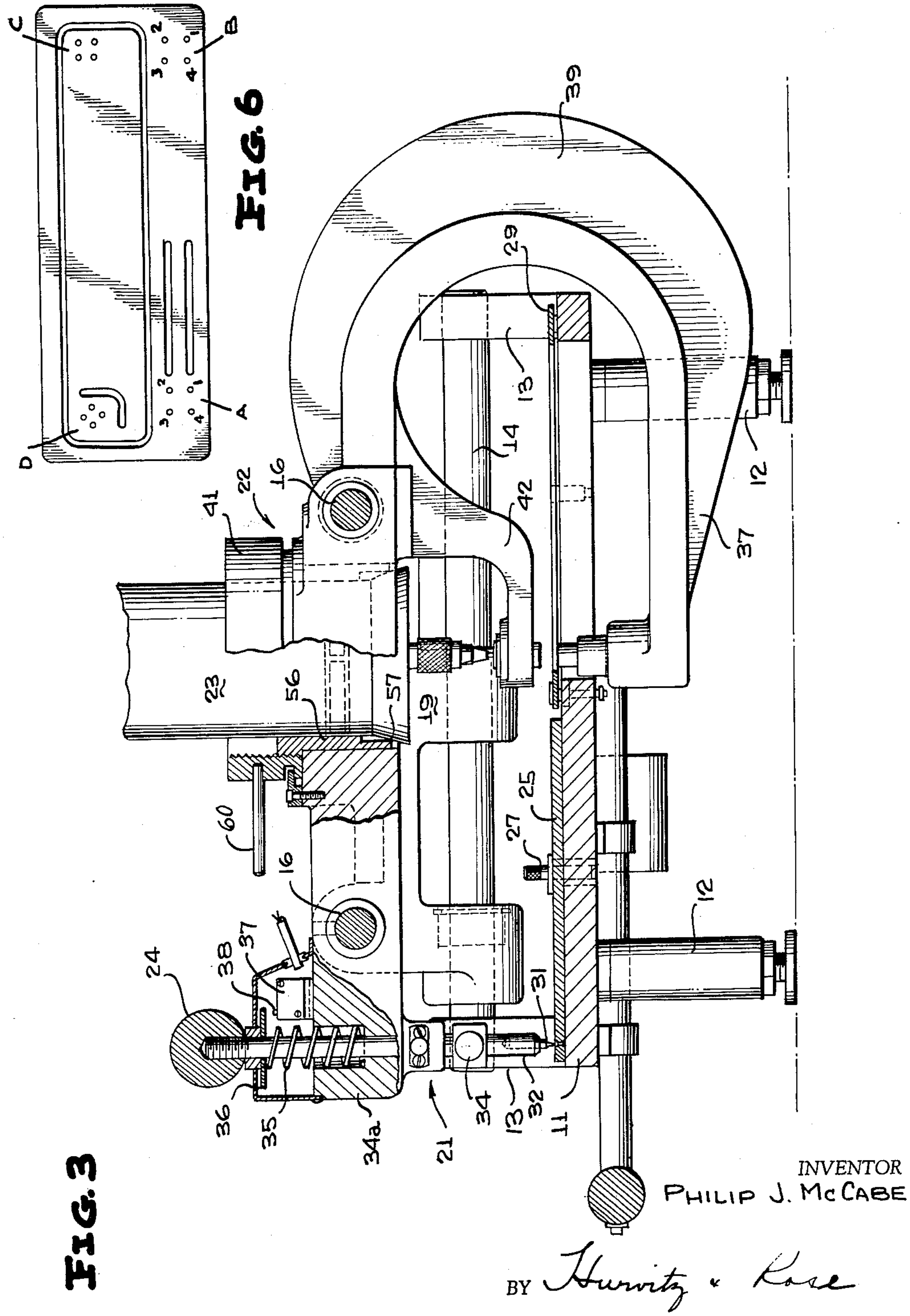
FIGURE 3 is a view in section taken on the line 3—3 of FIGURE 2.
FIGURE 6 is a view in plan of a guidance template, employed in routing lines.

Referring now more specifically to FIGURE 6, there is illustrated a transparent template guide, according to the invention which enables the operator accurately to drill or punch holes, and rout lands, arcs, and tangents on grid lines or half-way between grid lines. The template also simplifies drilling transistor patterns.

To trace conductor paths (and arcs) on the grid lines:

(a) Locate the desired groove in the template over the conductor line of the sketch A (FIGURE 1).

(b) Insert keying pins in holes A1 and B1 (FIGURE 6).

(c) Press keying pins into holes in the reference template 25.

(d) Trace the conductor pattern with the stylus 31, using the groove as a guide.

To shift to points on a horizontal line, but half-way between vertical lines:

(a) Spot the desired point through any convenient hole in pattern D.

(b) Use keying pins in holes A4 and B4.

To shift to points on a vertical line, but halfway between horizontal lines:

(a) Spot the desired point through any hole in pattern D.

(b) Use keying pins in holes A2 and B2.

To shift to points half-way between both horizontal and vertical lines:

(a) Spot the desired point through any hole in pattern D.

(b) Use keying pins in holes A3 and B3.

To trace conductor paths half-way between the grid lines:

(a) Locate the desired groove over the conductor line of the sketch.

(b) Use keying pins in holes A4 and B4 (or A3 and B3).

(c) Trace conductor as in step (d) above.

To trace diagonal paths:

(a) Locate the groove over the conductor line of the sketch.

(b) Insert one keying pin in hole B1.

(c) Insert other keying pin in slot I.

(d) Slide template until pins can be pressed into holes in the reference template.

To drill transistor patterns utilize hole patterns C and D.

By employing grid 25 having a multiplicity of tapered apertures having equal mutual spacings, it is not necessary for detailed draftsman work in preparing the original drawing which is placed on sheet 28. The drafting work can be done on standard graph-type paper in a free-hand manner. Any discrepancies between the desired points at which a hole is to be drilled and the actual point at which the hole is drilled are rectified by the accurately located tapered apertures in grid sheet 25, in conjunction with tapered stylus 31. As the stylus 31 is moved from one point to another and depressed into contact with the grid 25, via sketch A, plate 36 actuates microswitch 37 bringing the bit 47 into engagement with Mylar sheet 29 and so that it seats into bore 49. When utilizing the device for routing of the Mylar strip, the microswitch is deactivated by a standard toggle switch T, so that only initial positioning of gouging tool 55 with respect to sheet 29, by adjusting ring 41, is required.

Once the Mylar sheet has been gouged and drilled it serves as a master plate for the manufacture of printed circuit boards.

While I have described and illustrated one specific embodiment of my invention, it will be clear that variations of the details of construction which are specifically illustrated and described may be resorted to without departing from the true spirit and scope of the invention as defined in the appended claims.

What is claimed is:

1. Apparatus for the formation of an accurate array of holes and grooves in a work sheet from an informal design sketch only roughly approximating the desired accuracy of the array to be transferred to said worksheet, said apparatus comprising a reference plate having a precision machined universal indexing pattern thereon, means for securing said informal design sketch in intimate contact with said precision pattern, means for fastening said worksheet in fixed position relative to the secured informal design sketch, tool means movable over said worksheet and operative to form said accurate array therein, stylus means movable over said indexing pattern and said design sketch, means for guiding the movement of said tool means in accordance with the movement of said stylus means so that said tool means is adapted to trace out a pattern on said worksheet corresponding to the pattern traced by said stylus means, and means for controlling the operation of said tool means to form a desired portion of said array only when said stylus means is in mating association with a point of said indexing pattern of said reference plate, so that said informal design sketch is solely a rough guide for the transfer of an accurately located array of holes to said worksheet which correspond with the precision machined indexing pattern of said reference plate; wherein said indexing pattern comprises a plurality of equi-spaced apertures arranged in said plate in a precise grid, said informal design sketch being secured as an overlay on said grid, said stylus means being adapted to mate separately with each of said apertures in said grid by controlled perforation of said design sketch only when in alignment with an aperture adjacent a desired hole location on said design sketch.

2. The combination according to claim 1 wherein is included means for actuating said means for controlling the operation of said tool means to form holes in said worksheet in response to the mating of said stylus means and an aperture in said grid.

3. The combination according to claim 1 wherein said tool means comprises groove forming means and wherein is further included a reference template having a plurality of slots in arbitrary arrangement therein, said template being movable relative to said design sketch to a plurality of fixed positions, and means for keying and securing said template to said reference plate on said informal design sketch in each of said plurality of fixed positions, whereby to guide said stylus means, and thereby said groove forming means, in the formation of grooves in said worksheet.

4. The combination according to claim 3 wherein is included means for adjusting the position of said groove forming means relative to said worksheet to control the depth of the groove formed therein.

5. Apparatus for the formation of a precise array of holes in a worksheet by reference to an approximation of the desired relative locations of the holes as represented by points in a freehand design sketch on a perforable sheet, said apparatus comprising a reference template having a multiplicity of equi-spaced openings therein arranged in a precision grid pattern over which said perforable sheet is to be placed; means for fastening said perforable sheet in position over said grid pattern; stylus means movable over the area encompassed by said grid pattern for perforating said perforable sheet by reference to said points; the perforation being effected only when said stylus means is in alignment with an opening in said template, and thereby being accompanied by a mating of said stylus means and the aligned opening; means for maintaining said worksheet in fixed position relative to the fastened perforable sheet; hole forming means operatively connected to said stylus means for coordinate movement therewith over said worksheet as said stylus means is moved over said perforable sheet and said grid pattern; means for energizing said hole forming means to form said array in said worksheet in response to perforation of said perforable sheet by said stylus means; whereby said freehand design sketch is only a guide for the approximate location of holes in said array, the precise relative locations of perforations in said perforable sheet, and thus of holes in said worksheet, being controlled by said precision grid pattern.

6. The method of forming an array of holes in a workpiece in accordance with a desired accuracy by selective transfer of the hole locations in the pattern of a precise grid to the workpiece in response to the tracing of a freehand sketch overlay on said grid, said sketch including indica approximating the hole locations of the desired array, said method comprising the steps of marking a hole location of said grid at a point on said sketch immediately adjacent an indicia representative of a hole location in said array, simultaneously therewith forming a hole at a corresponding location in said workpiece, and continuing to mark hole locations on said sketch by reference to the hole locations in said grid nearest the respective indicia on said sketch while maintaining coordinated movement and formation of said holes in said workpiece with the respective movement and marking of said sketch in proceeding from indicia to indicia of said sketch at which hole locations in said array are represented; thereby to form said array of holes, with precise relative locations of the holes in said array controlled by said grid in conjunction with the general relative locations thereof governed by the appropriate indicia on said sketch.

7. A machine for deriving an accurate pattern of holes and lines in a sheet to be utilized as a master sheet for printed circuit artwork, from a rough sketch of the pattern, comprising a plate having a multiplicity of index points arranged in an orderly grid, means for securing said sketch in position on said plate over said grid, means for maintaining said sheet in fixed relation with said plate, a stylus, a tool assembly, said stylus and tool assembly being mounted in fixed relation with each other and in movable relation with said sheet and said plate, said stylus being movable to cover the area coinciding with the placement of said sketch and said tool assembly being movable to cover the area coinciding with said sheet, whereby said sketch may be used as a guide for said stylus in controlling the movement of said tool assembly in the formation of said accurate pattern, said sketch being perforable upon alignment of said stylus with an index point of said grid so that said stylus mates with said index point, and means for controlling the operation of said tool assembly to form said accurate pattern in response to the mating of said stylus and index points selected by reference to said sketch.

References Cited by the Examiner

UNITED STATES PATENTS

| | | | |
|---|---|---|---|
| 1,154,596 | 9/1915 | Baldridge | 33—23 |
| 1,247,051 | 11/1917 | Wilson | 95—79 |
| 1,389,462 | 8/1921 | Spreadbury | 33—23 X |
| 1,923,208 | 8/1933 | Hovvey | 33—25 X |
| 2,020,185 | 11/1935 | Hoe | 33—23 |
| 2,037,764 | 4/1937 | Daneker | 95—79 |
| 2,268,293 | 12/1941 | Lundeberg | 77—64 |
| 2,902,760 | 9/1959 | Koenig | 33—18 X |
| 2,975,661 | 3/1961 | Coleman | 77—32.2 |

FOREIGN PATENTS

| | | |
|---|---|---|
| 1,265,334 | 5/1961 | France. |

ISAAC LISANN, *Primary Examiner.*

HARRY N. HAROIAN, *Assistant Examiner.*